(12) United States Patent
Wang et al.

(10) Patent No.: US 10,277,122 B1
(45) Date of Patent: Apr. 30, 2019

(54) CHARGE PUMP CIRCUIT AND PHASE LOCKED LOOP SYSTEM USING THE SAME

(71) Applicant: NATIONAL CHIAO TUNG UNIVERSITY, Hsinchu (TW)

(72) Inventors: Shih-Hsing Wang, Hsinchu (TW); Chung-Chih Hung, Tainan (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/116,078

(22) Filed: Aug. 29, 2018

(30) Foreign Application Priority Data

Feb. 26, 2018 (TW) .............................. 107106432 A

(51) Int. Cl.
*H02M 3/07* (2006.01)
*H03L 7/06* (2006.01)
*H03L 7/093* (2006.01)
*H03K 21/08* (2006.01)
*H03L 7/099* (2006.01)

(52) U.S. Cl.
CPC .............. *H02M 3/07* (2013.01); *H03K 21/08* (2013.01); *H03L 7/093* (2013.01); *H03L 7/099* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,385,265 B1* | 5/2002 | Duffy | .................... | H03L 7/0893 327/148 |
| 6,472,915 B1* | 10/2002 | Moyal | ................... | H03L 7/0896 327/157 |
| 6,825,730 B1* | 11/2004 | Sun | ........................ | H03L 7/0898 331/16 |

* cited by examiner

*Primary Examiner* — An T Luu
(74) *Attorney, Agent, or Firm* — Muncy, Geissler, Olds & Lowe, P.C.

(57) ABSTRACT

A charge pump circuit and a phase-locked loop (PLL) system using the same are provided. The charge pump circuit includes an upper current source, a lower current source and a plurality of switches. The switches are turned on or off by an error signal to increase or decrease the control voltage of the voltage-controlled oscillator (VCO) and further control the frequency of the output signal of the VCO. When the reference frequency signal matches with the divided frequency signal from the VCO, the upper current source and the lower current source are bypassed to decrease the voltage across the MOSFET, thereby minimizes the influence of the leakage current on the control voltage of VCO. In this way, the output jitter can be reduced due to smaller magnitude of peak-to-peak voltage on the control voltage of VCO in the PLL system caused by the leakage current of the MOSFET.

10 Claims, 9 Drawing Sheets

CHARGE PUMP CIRCUIT AND PHASE LOCKED LOOP SYSTEM USING THE SAME

CROSS-REFERENCE TO RELATED APPLICATION

This application claims the benefit of Taiwan Patent Application No. 107106432, filed on Feb. 26, 2018, in the Taiwan Intellectual Property Office, the disclosure of which is incorporated herein in its entirety by reference.

BACKGROUND OF THE INVENTION

1. Field of the Invention

The present invention generally relates to a charge pump circuit and a phase-locked loop system, more particularly to a charge pump circuit which is able to reduce the output jitter caused by smaller magnitude of peak-to-peak voltage on the control voltage of VCO in the PLL system subject to the leakage current of the charge pump circuit, and a phase-locked loop system using the same.

2. Description of the Related Art

The charge pump circuit is a component widely used in various circuits, and more particularly to the phase lock loop circuit. Please refer to FIG. 1, which shows a conventional phase-locked loop system 100 comprising a phase frequency detector 200, a charge pump circuit 300, a filter 400, a voltage-controlled oscillator 500 and a frequency divider 600.

The output signal outputted from the phase-locked loop system 100 is feedback to the frequency divider 600, and the frequency divider 600 then generates a divided frequency signal, and the phase frequency detector 200 compares the phases and frequencies of the divided frequency signal and a reference frequency signal, to provide the error signal, and transmit the error signal to the charge pump circuit 300. The charge pump circuit 300 can provide the control voltage of the voltage-controlled oscillator 500 according to increasing or decreasing of the error signal, so that the voltage-controlled oscillator 500 can adjust the phase and frequency of the output signal, to achieve a phase and frequency locked state.

In the phase-locked loop system 100, because the variation of the control voltage of the voltage-controlled oscillator 500 relates to the stability of the phase and the frequency of the output signal, how to stably maintain the control voltage at a voltage level is a key factor for the phase-locked loop system 100.

However, in the phase-locked loop system 100, when the phase-locked loop system is at phase locked state, the control voltage on the control voltage terminal may be unstable subject to the leakage current of the charge pump circuit 300, and the smaller magnitude of peak-to-peak voltage on the control voltage may cause the jitter of the output signal of the VCO, so the phase-locked loop system 100 is difficult to be reach the phase and frequency locked state.

Generally, the leakage current of the charge pump circuit 300 can usually be classified into four types, as shown in FIG. 2.

The first type leakage current is the gate tunnel leakage current (such as paths ① and ③ as shown in FIG. 2). With improvement of the process technology, a thickness of the oxide layer of the gate becomes lower, so the gate tunnel leakage current increases exponentially.

The second type leakage current is the junction leakage current (such as paths ②, ③ and ④ shown in FIG. 2). When the transistor is at off-state, the junction is applied by a reverse bias voltage, so the junction leakage current flowing from the source or the drain to the substrate is formed.

The third type leakage current is the gate-induced drain-leakage current (such as the path ② shown in FIG. 2). The gate-induced drain-leakage current is formed because of the high electric field effect of the drain.

The fourth type leakage current is the subthreshold leakage current (such as path ② shown in FIG. 2). The subthreshold leakage current is a drain-source current formed when the transistor is operated in a weak inversion mode.

FIG. 3 shows the current versus voltage curves of the four leakage currents. As shown in FIG. 3, the subthreshold leakage current is the main source of the leakage current of the charge pump circuit, and is almost $10^5$ times of other-type leakage currents. Therefore, when the influence of the subthreshold leakage current on the control voltage can be minimized, the output jitter caused by smaller magnitude of peak-to-peak voltage on the control voltage can be greatly reduced.

The subthreshold leakage current $I_{sub}$ can be expressed by the following equation:

$$I_{sub} = I_0 e^{\frac{V_{GS}-V_{th}}{nV_T}} \left(1 - e^{\frac{-V_{DS}}{V_T}}\right)$$

When $V_{DS}$ is 0, $I_{sub}$ is 0, that is, when the drain-source voltage is zero, the subthreshold leakage current can become zero, so as to minimize the influence of the subthreshold leakage current on the control voltage.

The present invention is to provide a charge pump circuit and a phase-locked loop system using the same. When the phase-locked loop system is at phase locked state, the drain-source voltage of the transistor of the charge pump circuit in the phase-locked loop system can become almost zero, so as to decrease the subthreshold leakage current to minimize the influence of the leakage current on the control voltage, thereby reducing the output jitter caused by smaller magnitude of peak-to-peak voltage on the control voltage.

SUMMARY OF THE INVENTION

In order to solve conventional problems, the present invention is to provide a charge pump circuit and a phase-locked loop system using the same.

According to an embodiment, the present invention provides a charge pump circuit comprising an upper current source, a lower current source, a first switch, a second switch, a third switch, a fourth switch, a fifth switch, a unity gain amplifier. The upper current source is disposed between a power supply terminal and a first node, and configured to provide a first current. The lower current source is disposed between a second node and ground, and configured to provide a second current. The first switch is electrically connected between the first node and a third node. The second switch is electrically connected between the third node and second node. The third switch is electrically connected between the first node and a fourth node. The fourth switch is electrically connected between the fourth node and second node. The unity gain amplifier is electrically connected between the third node and fourth node, and configured to transfer the voltage on the third node to the fourth node. The fifth switch is electrically connected between the first node and second node. The third node is a control voltage terminal, and the first switch is turned on or off by the first signal, and the second switch is turned on or off by the second signal, and the third switch is turned on or off by a third signal inverse to the first signal, and the fourth switch is turned on or off by a fourth signal inverse to the second signal, so as to use the first current or the second current to increase or decrease a control voltage on the control voltage terminal. The fifth switch is turned on or off by a fifth signal generated by an NOR operation or equivalent operation of the first signal and the second signal, so as to minimize influence of leakage currents of the first switch, the second switch, the third switch and the fourth switch on the control voltage on the control voltage terminal.

Preferably, each of the first switch, the second switch, the third switch, the fourth switch and the fifth switch comprises a N-type MOSFET, and gates of the first switch, the second switch, the third switch, the fourth switch and the fifth switch receive the first signal, the second signal, the third signal, the fourth signal and the fifth signal, respectively.

Preferably, each of the first switch, the second switch, the third switch, the fourth switch and the fifth switch comprises a P-type MOSFET parallelly connected to the N-type MOSFET thereof.

Preferably, a gate of the P-type MOSFET of the first switch, a gate of the P-type MOSFET of the second switch, a gate of the P-type MOSFET of the third switch, and a gate of the P-type MOSFET of the fourth switch receive the third signal, the fourth signal, the first signal and the second signal, respectively.

Preferably, a gate of the P-type MOSFET of the fifth switch receives a sixth signal generated by an OR operation of the first signal or the second signal, and the sixth signal is inverse to the fifth signal.

Preferably, when the first signal is at a high level and the second signal is at a low level, the first switch and the fourth switch are turned on, and the second switch, the third switch and the fifth switch are turned off, so as to increase the control voltage on the control voltage terminal by the first current.

Preferably, when the first signal is at the low level and the second signal is at the high level, the second switch and the third switch are turned on, and the first switch, the fourth switch and the fifth switch are turned off, so as to decrease the control voltage on the control voltage terminal by the second current.

Preferably, when the first signal and the second signal are at the low level, the third switch, the fourth switch and the fifth switch are turned on, and the first switch and the second switch are turned off.

Preferably, channel lengths of the N-type MOSFET and the P-type MOSFET of the fifth switch are lower than channel lengths of the N-type MOSFET and the P-type MOSFET of the third switch and the fourth switch, wherein the channel lengths of the N-type MOSFET and the P-type MOSFET of each of the third switch and the fourth switch are equal to each other.

Preferably, the third switch has a third equivalent resistance value, the fourth switch have a fourth equivalent resistance value, and the fifth switch have a fifth equivalent resistance value, the fifth equivalent resistance value is lower than a sum of the third equivalent resistance value and the fourth equivalent resistance value, so that when the fifth switch is turned on, the fifth switch substantially bypasses the upper current source and the lower current source, to make a voltage on the first node is substantially the same as a voltage on the second node, thereby minimizing the influence of the leakage currents the first switch, the second switch, the third switch and the fourth switch on the control voltage on the control voltage terminal.

According to an embodiment, the present invention provides a phase-locked loop system comprising a voltage-controlled oscillator, a filter, a frequency divider, a phase frequency detector and the above-mentioned charge pump circuit.

The voltage-controlled oscillator includes an input terminal served as a control voltage terminal, and an output terminal configured to output an output signal. The filter includes a terminal electrically connected to the control voltage terminal and the voltage-controlled oscillator, and other terminal grounded. The frequency divider is electrically connected to the output terminal of the voltage-controlled oscillator to receive the output signal, and configured to divide a frequency of the output signal to generate a divided frequency signal. The phase frequency detector is electrically connected to an input terminal to receive a reference frequency signal, and electrically connected to the frequency divider to receive the divided frequency signal, and configured to compare phases and frequencies of the reference frequency signal and the divided frequency signal, so as to output an error signal. The charge pump circuit is electrically connected to the phase frequency detector to receive the error signal, and configured to increase or decrease a control voltage on the control voltage terminal according to the error signal.

Preferably, when the phase and the frequency of the reference frequency signal match with that of the divided frequency signal, the phase frequency detector outputs the error signal in a long period where the charge pump does not need to charge or discharge, so as to turn on the fifth switch to substantially bypass the upper current source and the lower current source, thereby decreasing the voltage across the MOSFET and minimizing the influence of the leakage current of the charge pump circuit on the control voltage on the control voltage terminal.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
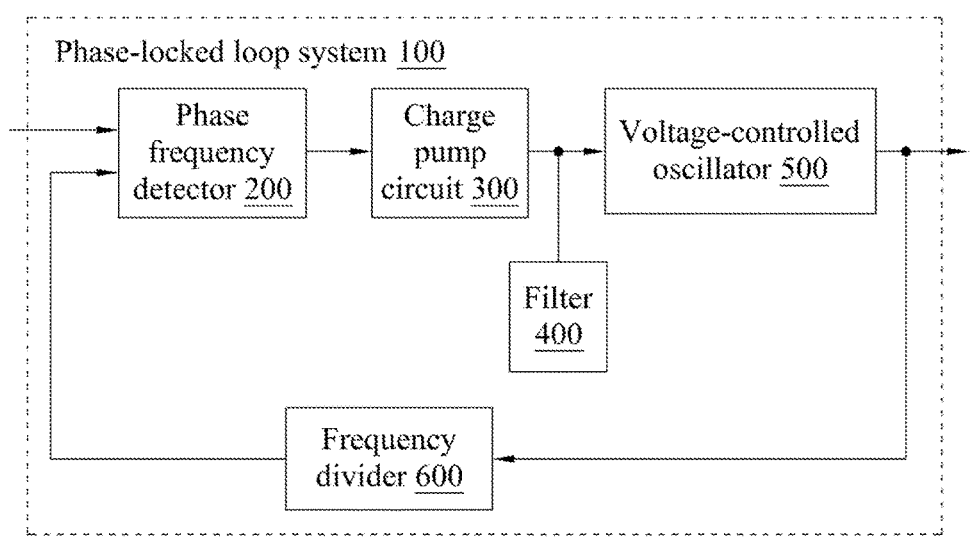
FIG. 1 is a structural diagram of a conventional phase-locked loop system.
Figure 2:
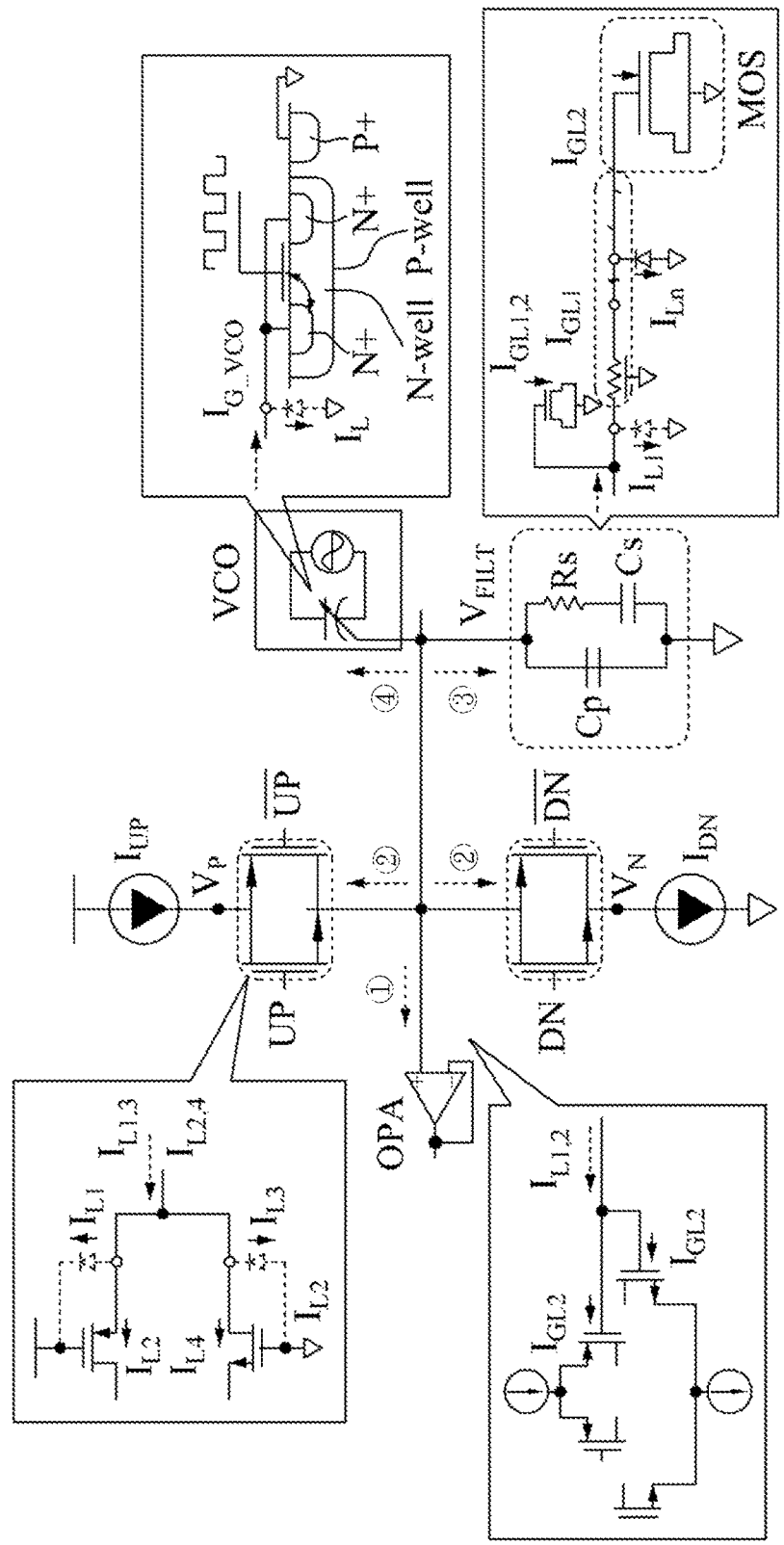
FIG. 2 is a schematic diagram of four leakage current in prior art.
Figure 3:
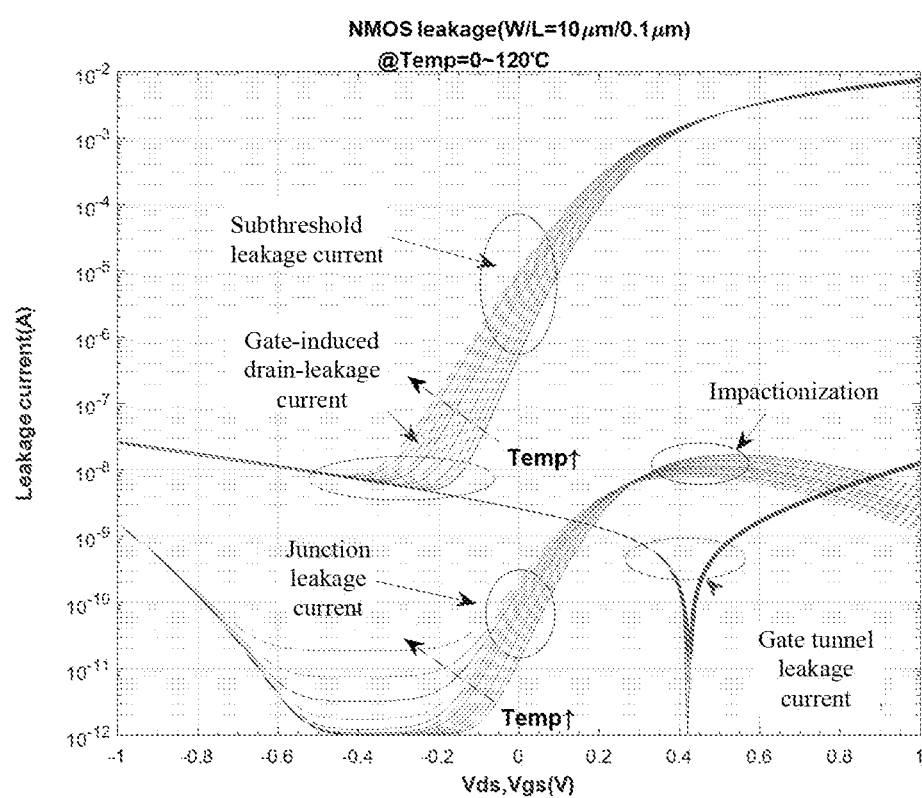
FIG. 3 shows voltage versus current curves of four leakage currents in prior art.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 4:
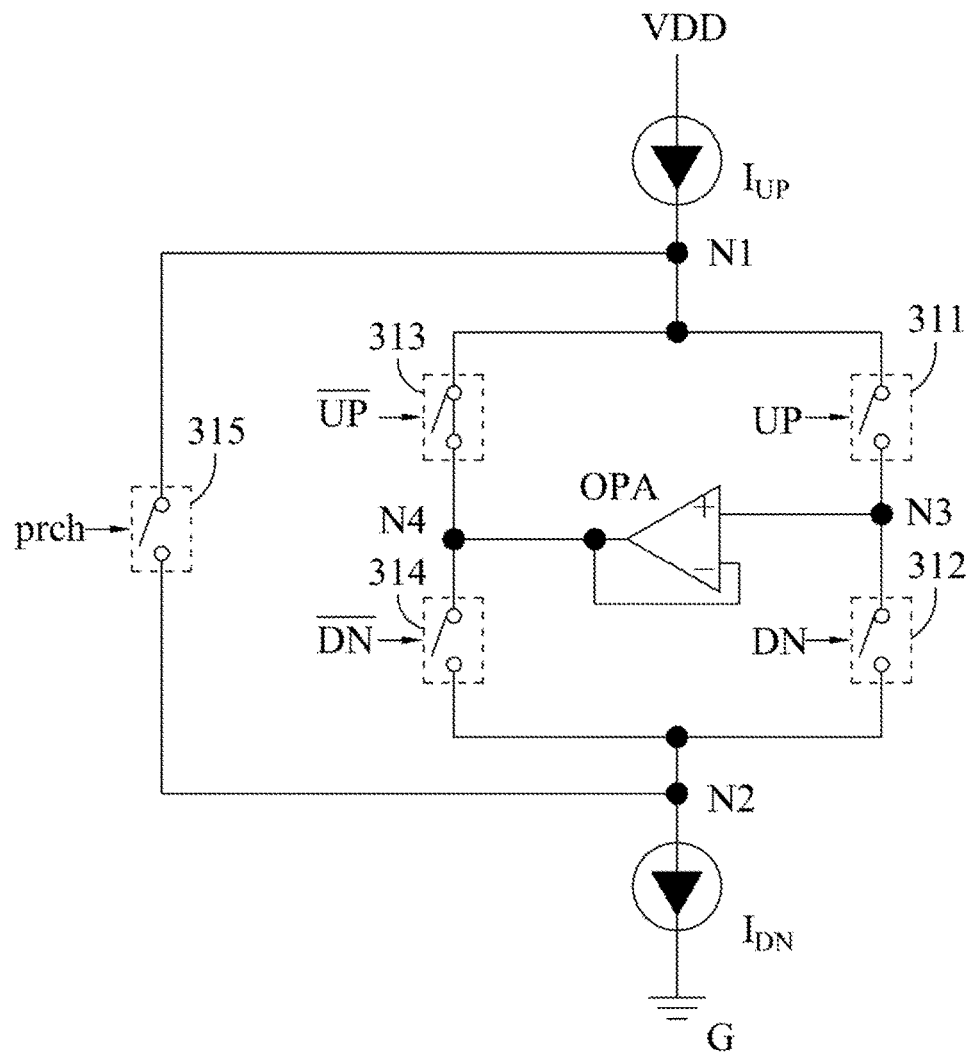
FIG. 4 is a schematic view of equivalent switches of a charge pump circuit, according to an embodiment of the present invention.

Please refer to FIG. 4, which is a schematic view of equivalent switches of a charge pump circuit of an embodiment of the present invention. As shown in FIG. 4, the charge pump circuit 300 comprises an upper current source IUP, a lower current source IDN, a first switch 311, a second switch 312, a third switch 313, a fourth switch 314, a fifth switch 315 and a unity gain amplifier OPA. The upper current source IUP is disposed between a power supply terminal VDD and a first node N1, and configured to provide a first current. The lower current source IDN is disposed between ground G and a second node N2, and configured to provide a second current. The first switch 311 is electrically connected between the first node N1 and a third node N3, the second switch 312 is electrically connected between the third node N3 and the second node N2, the third switch 313 is electrically connected between the first node N1 and a fourth node N4, the fourth switch 314 is electrically connected between the fourth node N4 and the second node N2, and the fifth switch 315 is electrically connected between the first node N1 and the second node N2. The unity gain amplifier OPA is electrically connected between the third node N3 and the fourth node N4 and configured to transfer the voltage on the third node N3 to fourth node N4, to implement better current matching, so that the charge pump circuit 300 can be operated with the first current and the second current varying with low swing. Each of the first switch 311, the second switch 312, the third switch 313, the fourth switch 314 and the fifth switch 315 can be a semiconductor gate-controlled switch, such as a MOSFET which is turned on or off by a voltage applied on a gate thereof.

In this embodiment, as shown in FIG. 4, the first switch 311 receives the first signal UP, the second switch 312 receive the second signal DN, the third switch 313 receives the third signal $\overline{UP}$ inverse to the first signal UP, the fourth switch 314 receives the fourth signal $\overline{DN}$ inverse to the second signal DN, and the fifth switch 315 receives the fifth signal (prch) which is generated by NOR operation or equivalent operation of the first signal UP and the second signal DN, that is, prch=$\overline{UP+DN}$.

The first switch 311 can be turned on or off by the first signal UP, the second switch 312 can be turned on or off by the second signal DN, the third switch 313 can be turned on or off by the third signal $\overline{UP}$ inverse to the first signal UP, the fourth switch 314 can be turned on or off by the fourth signal $\overline{DN}$ inverse to the second signal DN, and the fifth switch 315 can be turned on or off by the fifth signal (prch) generated by NOR operation or equivalent operation of the first signal UP and the second signal DN, that is, prch=$\overline{UP+DN}$, for example, the first signal UP and the second signal DN can be revered to generate the revered first signal $\overline{UP}$ and the revered second signal $\overline{DN}$, and the fifth signal (prch) can be then generated by AND operation of the revered first signal $\overline{UP}$ and the revered second signal $\overline{DN}$.

In this embodiment, when the first signal UP is at a high level and the second signal DN is at a low level, the first switch 311 and the fourth switch 314 of the charge pump circuit 300 are turned on, and the second switch 312, the third switch 313 and the fifth switch 315 are turned off. When the first switch 311 and the fourth switch 314 are turned on, and the second switch 312, the third switch 313 and the fifth switch 315 are turned off, the upper current source IUP can transmit the first current from the power supply terminal VDD to the third node N3, to increase the voltage on the third node N3. The third node N3 can be a control voltage terminal of a voltage controlled oscillator (VCO), and when control voltage rises, the control voltage can be inputted to the voltage-controlled oscillator, thereby increasing frequency of the output signal of the voltage-controlled oscillator.

In this embodiment, when the first signal UP is at the low level and the second signal DN is at the high level, the second switch 312 and the third switch 313 of the charge pump circuit 300 are turned on, and the first switch 311, the fourth switch 314 and the fifth switch 315 are turned off. When the second switch 312 and the third switch 313 are turned on, and the first switch 311, the fourth switch 314 and the fifth switch 315 are turned off, the lower current source IDN transmits the second current from the third node N3 to the ground G, so that the voltage on the third node N3 starts to fall, and the control voltage can be inputted to the voltage-controlled oscillator, thereby decreasing the frequency of the output signal of the voltage-controlled oscillator.

In this embodiment, when the first signal UP and the second signal DN are at the low level, the control voltage is not adjusted and the fifth switch 315 is turned on; in this time, the fifth switch 315 substantially bypasses the upper current source IUP and the lower current source IDN. In actual application, under a condition that the first switch 311, the second switch 312, the third switch 313 and the fourth switch 314 are implemented by semiconductor devices, when the currents of the upper current source IUP and the lower current source IDN flow through the switch, the leakage currents of these switches may affect the control voltage. For this reason, the fifth switch 315 can be turned on to bypass the upper current source IUP and the lower current source IDN, to decrease the leakage currents of these switches, so as to minimize the influence of the leakage currents for the control voltage, thereby reducing the output jitter caused by smaller magnitude of peak-to-peak voltage on the control voltage.

Figure 5:
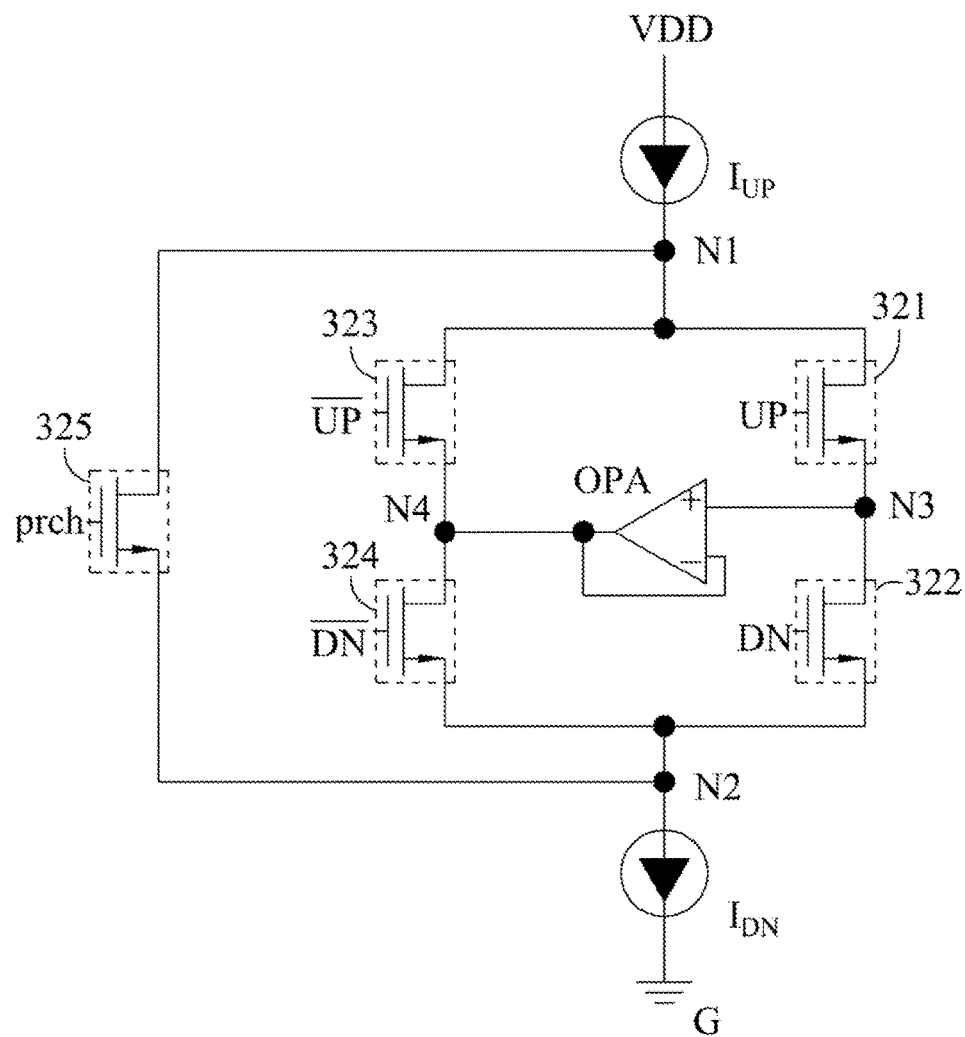
FIG. 5 is a schematic circuit diagram of a charge pump circuit, according to another embodiment of the present invention.

Please refer to FIG. 5, which is a schematic view of a charge pump circuit of another embodiment of the present invention. The first switch 311, the second switch 312, the third switch 313, the fourth switch 314 and the fifth switch 315 are implemented by N-type MOSFETs, so as to form five N-type MOSFET switches. The embodiment of FIG. 5 further comprises the N-type MOSFET switches, but other structures and configuration of the embodiment of FIG. 5 is substantially the same as that of the embodiment of FIG. 4, so the detailed descriptions are not repeated.

In this embodiment, the gate of the first N-type MOSFET switch 321, the gate of the second N-type MOSFET switch 322, the gate of the third N-type MOSFET switch 323, the gate of the fourth N-type MOSFET switch 324, and the gate of the fifth N-type MOSFET switch 325 receive the first signal UP, the second signal DN, the third signal $\overline{\text{UP}}$, the fourth signal $\overline{\text{DN}}$ and the fifth signal (prch), respectively.

When the first signal UP is at the high level and the second signal DN is at the low level, the first N-type MOSFET switch 321 and the fourth N-type MOSFET switch 324 of the charge pump circuit 300 are turned on, and the second N-type MOSFET switch 322, the third N-type MOSFET switch 323 and the fifth N-type MOSFET switch 325 are turned off. When the first N-type MOSFET switch 321 and the fourth N-type MOSFET switch 324 are turned on, and the second N-type MOSFET switch 322, the third N-type MOSFET switch 323 and the fifth N-type MOSFET switch 325 are turned off, the upper current source IUP can transmit the first current from the power supply terminal VDD to the third node N3, to increase the voltage on the third node N3, that is, the control voltage rises.

When the first signal UP is at the low level and the second signal DN is at the high level, the second N-type MOSFET switch 322 and the third N-type MOSFET switch 323 of the charge pump circuit 300 are turned on, and the first N-type MOSFET switch 321, the fourth N-type MOSFET switch 324 and the fifth N-type MOSFET switch 325 are turned off. When the second N-type MOSFET switch 322 and the third N-type MOSFET switch 323 are turned on, and the first N-type MOSFET switch 321, the fourth N-type MOSFET switch 324 and the fifth N-type MOSFET switch 325 are turned off, so that the lower current source IDN cam transmit the second current from the third node N3 to the ground G, and the voltage on the third node N3 starts to fall, that is, the control voltage falls.

When the first signal UP and the second signal DN are at the low level, it indicates that the control voltage does not need to adjust, the fifth N-type MOSFET switch 325 is turned on. In this time, the fifth switch 315 substantially bypasses the upper current source IUP and the lower current source IDN, to effectively reduce the leakage current of the first N-type MOSFET switch 321, the second N-type MOSFET switch 322, the third N-type MOSFET switch 323 and the fourth N-type MOSFET switch 324, so as to minimize the influence of the leakage current of the charge pump circuit 300 on the control voltage, thereby reducing the output jitter caused by smaller magnitude of peak-to-peak voltage on the control voltage.

Figure 6:
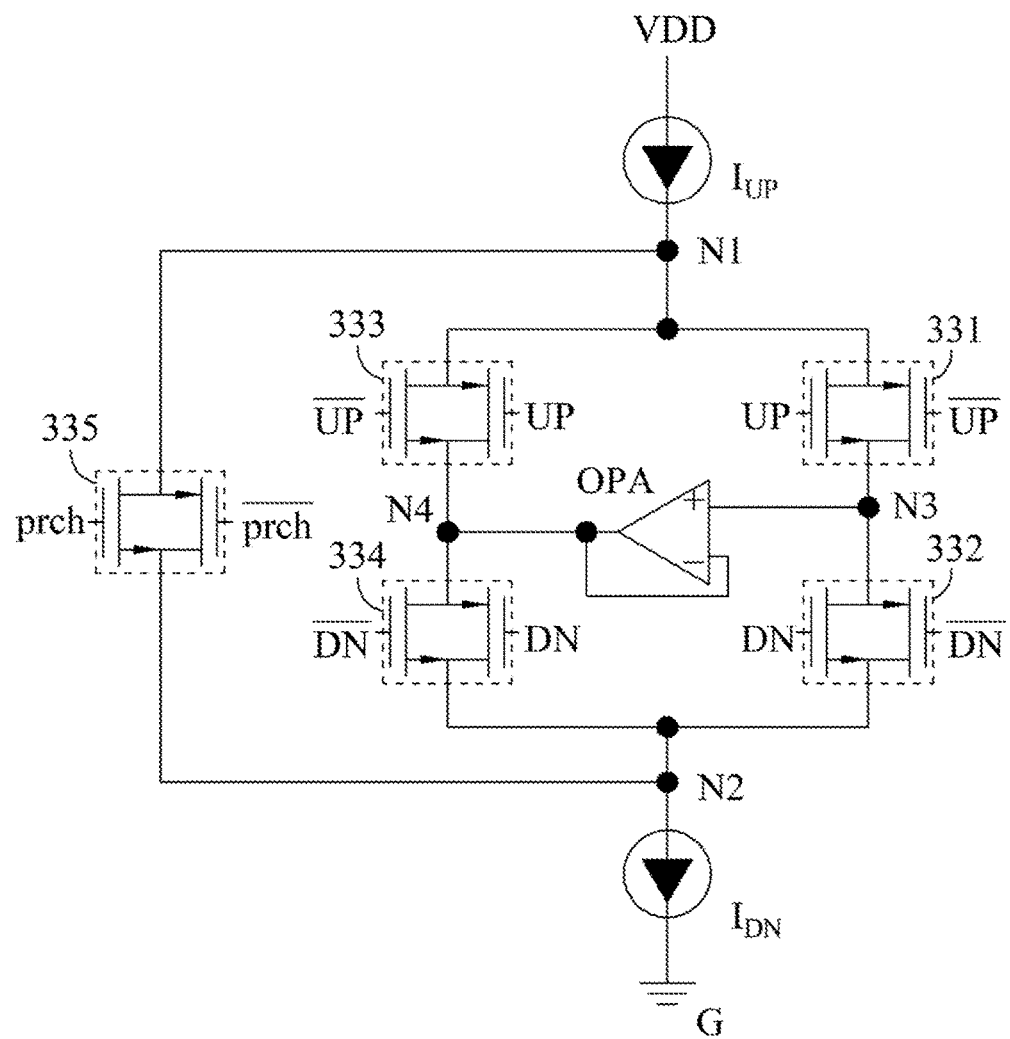
FIG. 6 is a schematic circuit diagram of a charge pump circuit, according to another embodiment of the present invention.

Please refer to FIG. 6, which is a schematic view of a charge pump circuit 300 of another embodiment of the present invention. As shown in FIG. 6, the switches are implemented by a first CMOSFET switch 331, a second CMOSFET switch 332, a third CMOSFET switch 333, a fourth CMOSFET switch 334 and a fifth CMOSFET switch 335; in other words, each N-type MOSFET switch of FIG. 5 is parallelly connected to P-type MOSFET to form the CMOSFET switch of FIG. 6.

The embodiment of FIG. 6 further comprises the P-type MOSFETs parallelly connected to the N-type MOSFET, respectively, but the configurations of other components of the embodiment of FIG. 6 are substantially the same as that of the embodiments of FIGS. 4 and 5, so the detailed descriptions of the same parts are not repeated.

In this embodiment, each of the first CMOSFET switch 331, the second CMOSFET switch 332, the third CMOSFET switch 333, the fourth CMOSFET switch 334 and the fifth CMOSFET switch 335 comprises the P-type MOSFET parallelly connected to the N-type MOSFET thereof. The gate of the P-type MOSFET of the first CMOSFET switch 331 receives the third signal $\overline{\text{UP}}$, the gate of the P-type MOSFET of the second CMOSFET switch 332 receives the fourth signal $\overline{\text{DN}}$, the gate of the P-type MOSFET of the third CMOSFET switch 333 receives the first signal UP, the gate of the P-type MOSFET of the fourth CMOSFET switch 334 receives the second signal DN, and the gate of the P-type MOSFET of the fifth CMOSFET switch 335 receives the sixth signal $\overline{\text{prch}}$ inverse to the fifth signal (prch).

When the first signal UP is at the high level and the second signal DN is at the low level, the first CMOSFET switch 331 and the fourth CMOSFET switch 334 of the charge pump circuit 300 are turned on, and the second CMOSFET switch 332, the third CMOSFET switch 333 and the fifth CMOSFET switch 335 are turned off. When the first CMOSFET switch 331 and the fourth CMOSFET switch 334 are turned on, and the second CMOSFET switch 332, the switch 333 and the fifth CMOSFET switch 335 of the third MOSFET are turned off, the current source $I_{UP}$ can transmit the first current voltage from the power supply terminal VDD to the third node N3, so as to increase the voltage on the third node N3, that is, the control voltage rises.

When the first signal UP is at the low level and the second signal DN is at the high level, the second CMOSFET switch 332 and the third CMOSFET switch 333 of the charge pump circuit 300 are turned on, and the first CMOSFET switch 331, the fourth CMOSFET switch 334 and the fifth CMOSFET switch 335 are turned off. When the second CMOSFET switch 332 and the third CMOSFET switch 333 are turned on, and the first CMOSFET switch 331, the fourth CMOSFET switch 334 and the fifth CMOSFET switch 335 are turned off, the lower current source IDN can transmit the second current from the third node N3 to the ground G, so that the voltage on the third node N3 starts to fall, that is, the control voltage is dropped.

When the first signal UP and the second signal DN are at low level, it indicates that the control voltage does not need to adjust, and the fifth switch 315 is turned on. In this time, the fifth switch 315 substantially bypasses the upper current source IUP and the lower current source IDN. When the currents of the upper current source IUP and the lower current source IDN flow through the first N-type MOSFET switch 321, the second N-type MOSFET switch 322, the third N-type MOSFET switch 323, the fourth N-type MOSFET switch 324, the leakage current may affect the control voltage. For this reason, the fifth N-type MOSFET switch 325 can be turned on to bypass the upper current source IUP and the lower current source IDN, so as to decrease the voltage across each MOSFET to reduce the leakage currents of the switches, thereby minimizing the influence of the leakage current on the control voltage and further reducing the output jitter caused by smaller magnitude of peak-to-peak voltage on the control voltage.

Figure 7:
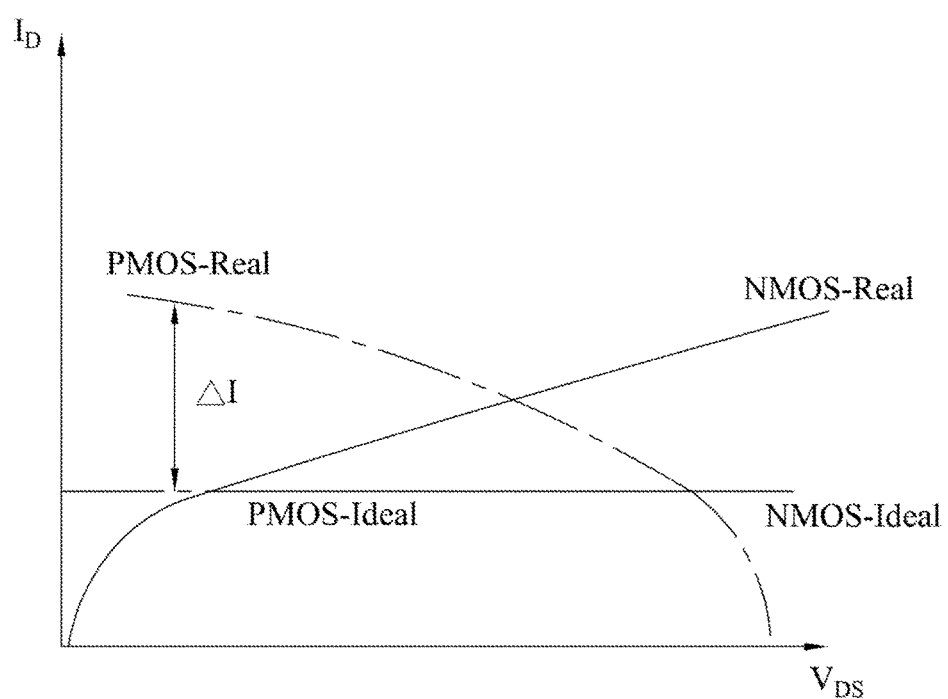
FIG. 7 shows current versus voltage curves of P-type MOSFET and N-type MOSFET.

Please refer to FIG. 7, which shows current versus voltage curves of P-type MOSFET and N-type MOSFET. Ideally, when the voltage $V_{DS}$ exceeds the threshold voltage Vth, the current $I_D$ of each of the P-type MOSFET and N-type MOSFET is a saturation current, as shown the curve PMOS-Ideal and NMOS-Ideal of FIG. 7. However, in actual application, when the $V_{DS}$ exceeds the threshold voltage Vth, the current $I_D$ of each of the P-type MOSFET and N-type MOSFET still changes in response to the change in voltage $V_{DS}$, as shown the curve PMOS-Real and NMOS-Real of FIG. 7. According to Ohm's law, the current versus voltage curve can be transferred to an equivalent resistance versus voltage curve. Please refer to FIG. 8, which shows equivalent resistance versus voltage curves of the P-type MOSFET and N-type MOSFET. According to channel length modulation effect of the MOSFET, the relationship equation can be expressed as following, $$I_D = \frac{\mu_n C_{ox}}{2} \frac{W}{L}(V_{GS} - V_{th})^2$$

wherein $\mu_n$ is electron mobility, $C_{ox}$ is a capacitance value of an oxide layer, W is a channel width, and L is a channel length.

According to aforementioned equation, the current $I_D$ can be changed by changing the channel length of the MOSFET. For example, when the channel length L becomes shorter, the current $I_D$ becomes higher; and, when the channel length L becomes longer, the current $I_D$ becomes lower. As a result, according to the Ohm's law, when the channel length L becomes shorter to make the current $I_D$ higher, the equivalent resistance of the MOSFET also becomes lower; and when the channel length L becomes longer to make the current $I_D$ lower, the equivalent resistance of the MOSFET also becomes higher.

It should be noted that the scope of the present invention is not limited to the embodiments shown in FIGS. 4, 5 and 6. In actual application, each of the switches, the N-type MOSFET switches and the CMOSFET switches should have equivalent resistance.

Please refer to FIG. 5. When the channel length of the N-type MOSFET of the fifth N-type MOSFET switch 325 is designed to be far shorter than the channel length of the N-type MOSFET of each of the third N-type MOSFET switch 323 and the fourth N-type MOSFET switch 324, the equivalent resistance value R5 of the fifth N-type MOSFET switch 325 can be far lower than one of the equivalent resistance value R3 and R4 of the third N-type MOSFET switch 323 and the fourth N-type MOSFET switch 324.

As described above, the equivalent resistance value R5 of the fifth N-type MOSFET switch 325 can be far lower than one of the equivalent resistance values R3 and R4 of the third N-type MOSFET switch 323 and the fourth N-type MOSFET switch 324. Please refer to FIG. 9, which is a schematic view of equivalent resistance values of a charge pump circuit of an embodiment of the present invention. The first N-type MOSFET switch 321 and the second N-type MOSFET switch 322 are turned off, so the equivalent resistance values of the first N-type MOSFET switch 321 and the second N-type MOSFET switch 322 can be infinite. However, the equivalent resistance value R5 of the fifth N-type MOSFET switch 325 can be far lower than one of the equivalent resistance value R3 and R4 of the third N-type MOSFET switch 323 and the fourth N-type MOSFET switch 324, so the fifth N-type MOSFET switch 325 can be turned on to substantially bypass the upper current source IUP and the lower current source IDN; in this time, the voltages on the first node N1 and the second node N2 are the same as each other, the voltage across MOSFET can be decreased, thereby minimizing the influence of the sub-threshold leakage currents of the first N-type MOSFET switch 321, the second N-type MOSFET switch 322, the third N-type MOSFET switch 323 and the fourth N-type MOSFET switch 324 on the control voltage.

Figure 8:
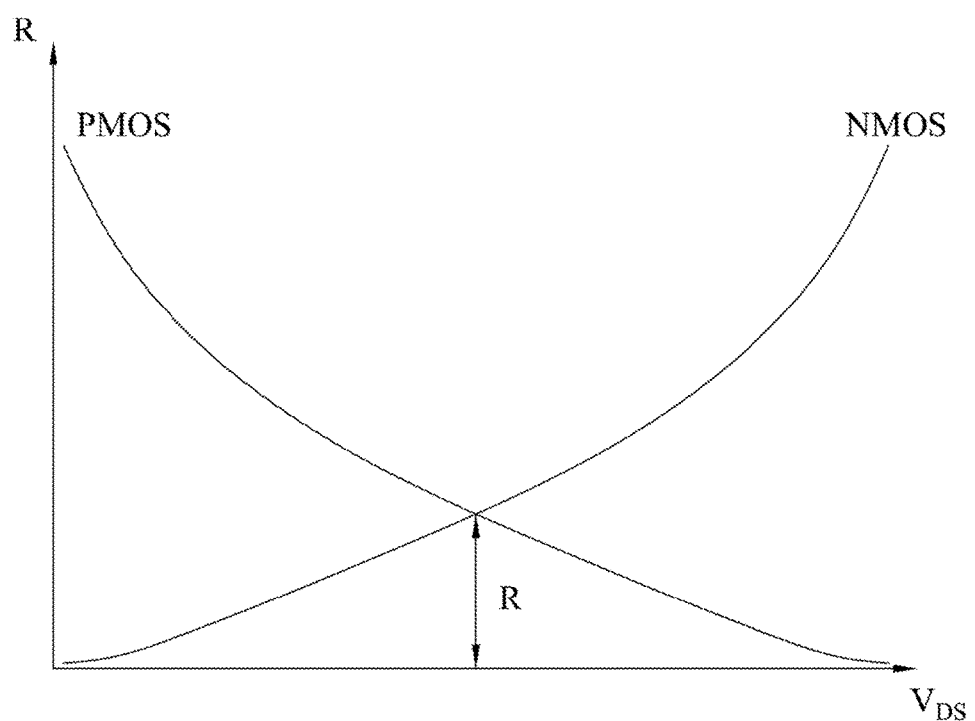
FIG. 8 shows equivalent resistance value versus voltage curves of P-type MOSFET and N-type MOSFET.

Please refer to FIGS. 6 and 7. In actual application, the current $I_D$ of each of the N-type MOSFET and the P-type MOSFET of the CMOSFET switch varies in response to the change in the voltage $V_{DS}$. For this reason, the current versus voltage curve can be transferred to equivalent resistance versus voltage curve, as shown in FIG. 8. The equivalent resistance versus voltage curves of the N-type MOSFET and P-type MOSFET can be intersected at a point with resistance value R. The N-type MOSFET and the P-type MOSFET of the CMOSFET switch are parallelly connected to each other, so the equivalent resistance value of the CMOSFET switch is preferably limited to the resistance R, according to the characteristic that the current flows through the shortest path, thereby reducing instability of the resistance value caused by source-drain voltage flutter or increasing energy required to turn on the switch.

With the channel length modulation effect of the N-type MOSFET and P-type MOSFET of the CMOSFET switch, the current $I_D$ of each of the N-type MOSFET and the P-type MOSFET varies according to the size of the MOSFET, that is, when the channel length is shorter, the current $I_D$ becomes higher; and when the channel length is longer, the current $I_D$ become lower. For this reason, the size of each of the N-type MOSFET and P-type MOSFET of the fifth CMOSFET switch 335 can be designed to be far smaller than the size of each of the N-type MOSFET and P-type MOSFET of each of the third CMOSFET switch 333 and the fourth CMOSFET switch 334, to make the equivalent resistance R5 of the fifth CMOSFET switch 335 far lower than each of the equivalent resistance values R3 and R4 of the third CMOSFET switch 333 and the fourth CMOSFET switch 334.

Figure 9:
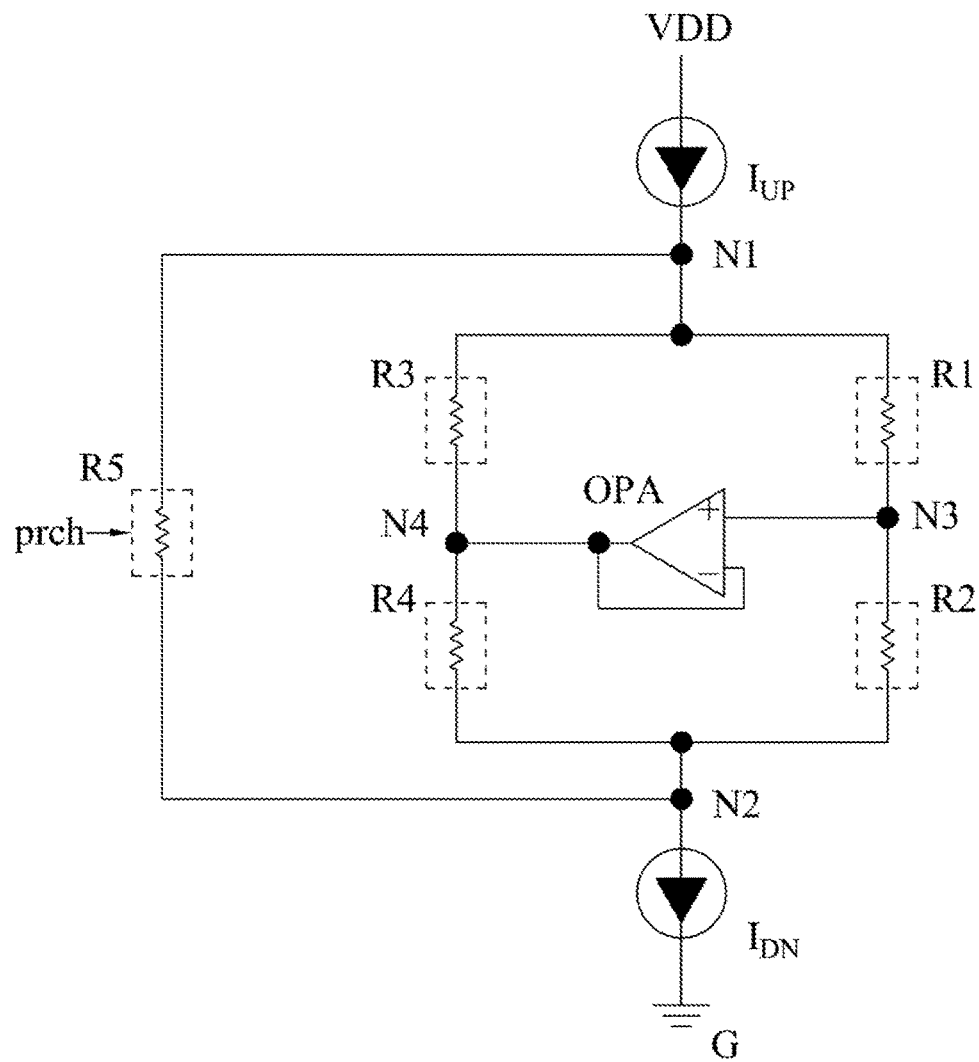
FIG. 9 shows a schematic view of equivalent resistance of the charge pump circuit, according to an embodiment of the present invention.

Please refer to FIG. 9. When the first signal UP and the second signal DN are at the low level, the first CMOSFET switch 331 and the second CMOSFET switch 332 are turned off, the equivalent resistors R1 and R2 of the first CMOSFET switch 331 and the second CMOSFET switch 332 can be considered infinity. The equivalent resistance R5 of the fifth CMOSFET switch 335 is far lower than each of the equivalent resistance values R3 and R4 of the third CMOSFET switch 333 and the fourth CMOSFET switch 334, so that the fifth CMOSFET switch 335 can be turned on to substantially bypass the upper current source IUP and the lower current source IDN, to make the voltages on the first node N1 and the second node N2 the same, thereby decreasing the voltage across each MOSFET to minimize the influence of the subthreshold leakage currents of the first CMOSFET switch 331, the second CMOSFET switch 332, the third CMOSFET switch 333 and the fourth CMOSFET switch 334 on the control voltage.

According to an embodiment, the present invention further provides a phase-locked loop system 100 comprising a voltage-controlled oscillator 500, a filter 400, a frequency divider 600, a phase frequency detector 200, and a charge pump circuit 300. The voltage-controlled oscillator 500 includes an input terminal served as the control voltage terminal (that is, the third node N3), and an output terminal to output the output signal. The filter 400 includes a terminal electrically connected to the control voltage terminal and the voltage-controlled oscillator 500, and other terminal grounded. The frequency divider 600 is electrically connected to the output terminal to receive the output signal, and configured to divide frequency of the output signal to generate the divided frequency signal. The phase frequency detector 200 is electrically connected to the input terminal of the phase-locked loop system 100 to receive reference frequency signal, and electrically connected to the frequency divider 600 to receive the divided frequency signal, and configured to compare phases and frequencies of the reference frequency signal and the divided frequency signal, to output the error signal. The charge pump circuit 300 can be one of charge pump circuits of aforementioned embodiments, and is electrically connected to the phase frequency detector 200 to receive the error signal, and configured to increase or decrease the control voltage on the control voltage terminal (that is, the third node N3), according to the error signal.

As described above, the phase frequency detector 200 compares the phases and the frequencies of the reference frequency signal and the divided frequency signal, to output error signal. When the phase and frequency of the reference frequency signal received by the phase frequency detector 200 is higher than or leads to that of the divided frequency signal, the phase frequency detector 200 outputs the error signal including the first signal UP at the low level and the second signal DN at the high level. When the phase and frequency of the reference frequency signal received by the phase frequency detector 200 is lower than or lag behind that of the divided frequency signal, the phase frequency detector 200 outputs the error signal including the first signal UP at the high level and the second signal DN at the low level. When the phase and frequency of the reference frequency signal received by the phase frequency detector 200 match with that of the divided frequency signal, the phase frequency detector 200 outputs the error signal including the first signal UP and the second signal DN both at the low level.

When the phase and the frequency of the reference frequency signal match with that of divided frequency signal, that is, the phase-locked loop system reaches the phase locked state, the phase frequency detector 200 outputs the error signal including the first signal UP and the second signal DN both at the low level. Based on the configuration of the fifth switch, fifth N-type MOSFET switch or fifth CMOSFET switch of the charge pump circuit 300, the source-drain voltages of the N-type MOSFETs and P-type MOSFETs of charge pump circuit 300 are almost the same as each other, so as to minimize the influence of the subthreshold leakage current of the MOSFET on the control voltage, thereby reducing the output jitter of the output jitter caused by smaller magnitude of peak-to-peak voltage on the control voltage.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A charge pump circuit, comprising:
an upper current source disposed between a power supply terminal and a first node, and configured to provide a first current;
a lower current source disposed between a second node and ground, and configured to provide a second current;
a first switch electrically connected between the first node and a third node;
a second switch electrically connected between the third node and the second node;
a third switch electrically connected between the first node and a fourth node;
a fourth switch electrically connected between the fourth node and the second node;
an unity gain amplifier electrically connected between the third node and the fourth node, and transfer the voltage on the third node to the fourth node; and
a fifth switch electrically connected between the first node and the second node;
wherein the third node is a control voltage terminal, and the first switch is turned on or off by a first signal (UP), and the second switch is turned on or off by a second signal (DN), and the third switch is turned on or off by a third signal $\overline{\text{UP}}$ inverse to the first signal, and the fourth switch is turned on or off by a fourth signal $\overline{\text{DN}}$ inverse to the second signal, so as to use the first current or the second current to increase or decrease a control voltage on the control voltage terminal;
wherein the fifth switch is turned on or off by a fifth signal (prch) generated by an NOR operation or equivalent operation of the first signal and the second signal $$(prch = \overline{UP+DN}).$$

2. The charge pump circuit according to claim 1, wherein each of the first switch, the second switch, the third switch, the fourth switch and the fifth switch comprises a N-type MOSFET, and gates of the first switch, the second switch, the third switch, the fourth switch and the fifth switch receive the first signal, the second signal, the third signal, the fourth signal and the fifth signal, respectively.

3. The charge pump circuit according to claim 2, wherein each of the first switch, the second switch, the third switch, the fourth switch and the fifth switch comprises a P-type MOSFET parallelly connected to the N-type MOSFET thereof;
wherein a gate of the P-type MOSFET of the first switch, a gate of the P-type MOSFET of the second switch, a gate of the P-type MOSFET of the third switch, and a gate of the P-type MOSFET of the fourth switch receive the third signal, the fourth signal, the first signal and the second signal, respectively;
wherein a gate of the P-type MOSFET of the fifth switch receives a sixth signal ($\overline{\text{prch}}$) generated by an OR operation of the first signal or the second signal ($\overline{\text{prch}}$=UP+DN), and the sixth signal is inverse to the fifth signal.

4. The charge pump circuit according to claim 2, wherein when the first signal is at a high level and the second signal is at a low level, the first switch and the fourth switch are turned on, and the second switch, the third switch and the fifth switch are turned off, so as to increase the control voltage on the control voltage terminal by the first current.

5. The charge pump circuit according to claim 2, wherein when the first signal is at a low level and the second signal is at a high level, the second switch and the third switch are turned on, and the first switch, the fourth switch and the fifth switch are turned off, so as to decrease the control voltage on the control voltage terminal by the second current.

6. The charge pump circuit according to claim 2, wherein when the first signal and the second signal are at a low level, the third switch, the fourth switch and the fifth switch are turned on, and the first switch and the second switch are turned off.

7. The charge pump circuit according to claim 3, wherein channel lengths of the N-type MOSFET and the P-type MOSFET of the fifth switch are lower than channel lengths of the N-type MOSFET and the P-type MOSFET of the third switch and the fourth switch, wherein the channel lengths of the N-type MOSFET and the P-type MOSFET of each of the third switch and the fourth switch are equal to each other.

8. The charge pump circuit according to claim 7, wherein the third switch has a third equivalent resistance value, the fourth switch have a fourth equivalent resistance value, and the fifth switch have a fifth equivalent resistance value, the fifth equivalent resistance value is lower than a sum of the third equivalent resistance value and the fourth equivalent resistance value, so that when the fifth switch is turned on, the fifth switch substantially bypasses the upper current source and the lower current source, to make a voltage on the first node is substantially the same as a voltage on the second node, thereby minimizing the influence of the leakage currents the first switch, the second switch, the third switch and the fourth switch on the control voltage on the control voltage terminal.

9. A phase-locked loop system, comprising:
a voltage-controlled oscillator comprising an input terminal served as a control voltage terminal, and an output terminal configured to output an output signal;
a filter comprising a terminal electrically connected to the control voltage terminal and the voltage-controlled oscillator, and other terminal grounded;
a frequency divider electrically connected to the output terminal of the voltage-controlled oscillator to receive the output signal, and configured to divide a frequency of the output signal to generate a divided frequency signal;
a phase frequency detector electrically connected to an input terminal to receive a reference frequency signal, and electrically connected to the frequency divider to receive the divided frequency signal, and configured to compare phases and frequencies of the reference frequency signal and the divided frequency signal, so as to output an error signal; and
a charge pump circuit according to one of claims 1 to 8, electrically connected to the phase frequency detector to receive the error signal, and configured to increase or decrease a control voltage on the control voltage terminal according to the error signal.

10. The phase-locked loop system according to claim 9, wherein the charge pump circuit uses a first current or a second current to increase or decrease the control voltage on the control voltage terminal, so as to enable the voltage-controlled oscillator to increase or decrease the frequency of the output signal;
wherein when the phase and the frequency of the reference frequency signal match with that of the divided frequency signal, the phase frequency detector outputs the error signal to turn on a fifth switch, so as to substantially bypass the upper current source and the lower current source, thereby minimizing the influence of the leakage current of the charge pump circuit on the control voltage on the control voltage terminal.

* * * * *